(12) United States Patent
Daubenspeck et al.

(10) Patent No.: US 7,989,358 B2
(45) Date of Patent: Aug. 2, 2011

(54) PREVENTION OF BACKSIDE CRACKS IN SEMICONDUCTOR CHIPS OR WAFERS USING BACKSIDE FILM OR BACKSIDE WET ETCH

(75) Inventors: Timothy H. Daubenspeck, Colchester, VT (US); Jeffrey P. Gambino, Westford, VT (US); Jerome B. Lasky, Essex Junction, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 12/107,303

(22) Filed: Apr. 22, 2008

(65) Prior Publication Data
US 2008/0191322 A1 Aug. 14, 2008

Related U.S. Application Data

(62) Division of application No. 11/462,124, filed on Aug. 3, 2006, now Pat. No. 7,405,139.

(51) Int. Cl.
*H01L 21/31* (2006.01)
(52) U.S. Cl. ........ 438/758; 438/584; 438/691; 438/692; 438/763; 438/764; 438/778

(58) Field of Classification Search .................. 438/584, 438/691, 692, 758, 763, 764, 778
See application file for complete search history.

(56) References Cited

U.S. PATENT DOCUMENTS

| 4,729,971 | A | 3/1988 | Coleman |
| 5,911,864 | A | 6/1999 | Eldridge |
| 6,514,835 | B1 | 2/2003 | Hendrix et al. |
| 6,790,125 | B2 | 9/2004 | Kane et al. |
| 6,844,623 | B1 | 1/2005 | Peterson et al. |
| 6,887,793 | B2 | 5/2005 | Chang et al. |
| 2004/0241461 | A1 | 12/2004 | Maurice et al. |
| 2006/0032834 | A1 | 2/2006 | Iguchi et al. |

FOREIGN PATENT DOCUMENTS

| JP | 06053204 A | 2/1994 |
| JP | 2004282035 A | 10/2004 |

*Primary Examiner* — Thanh V Pham
(74) *Attorney, Agent, or Firm* — Richard M. Kotulak, Esq.

(57) ABSTRACT

A method of preventing the formation of cracks on the backside of a silicon (Si) semiconductor chip or wafer during the processing thereof. Also provided is a method for inhibiting the propagation of cracks, which have already formed in the backside of a silicon chip during the processing thereof and prior to the joining thereto of a substrate during the fabrication of an electronic package. The methods entail either treating the backside with a wet etch, or alternatively, applying a protective film layer thereon prior to forming an electronic package incorporating the chip or wafer.

2 Claims, 2 Drawing Sheets

PREVENTION OF BACKSIDE CRACKS IN SEMICONDUCTOR CHIPS OR WAFERS USING BACKSIDE FILM OR BACKSIDE WET ETCH

CROSS REFERENCE TO RELATED APPLICATION

The present application is a divisional application of pending application Ser. No. 11/462,124, filed Aug. 3, 2006; now U.S. Pat. No. 7,405,139B2, issued Jul. 29, 2008.

BACKGROUND OF THE INVENTION

1. Field of the Invention

The present invention relates to a method of preventing the formation of cracks on the backside of a silicon (Si) semiconductor chip or wafer during the processing thereof. Furthermore, the invention is also concerned with a method for inhibiting the propagation of cracks, which have already formed in the backside of a silicon chip during the processing thereof and prior to the joining thereto of a substrate during the fabrication of an electronic package. Moreover, the invention is also directed to the provision of an electronic package incorporating a substrate, particularly such as in a flip chip arrangement, wherein the substrate is to be joined to a silicon semiconductor chip or wafer, which may be subject to the formation of scratches and cracks, and wherein novel measures are taken to prevent the formation or propagation of the scratches and/or cracks in the backside of the chip.

In essence, the backsides of silicon chips or wafers are occasionally subjected to the forming of scratches on the backside surfaces during fabrication or processing. These scratches may be caused by the polishing, milling or grinding of the backside of the respective silicon chip or wafer, such as for example, by means of a grinding process, wherein the surface finishing is accomplished by either numerically controlled milling machines, which may be followed by a manual polishing, various chemical and mechanical polishing compositions or slurries, or wet etching and the like procedures which are intended to remove the machine milling or fabrication marks and scratches.

Moreover, there is also the possibility that scratches or cracks may be formed on the backside of the silicon chip or wafer during the process of joining the latter to a substrate at high temperatures, such as during reflow, whereby during subsequent of the joined cooling components, the silicon chip tends to shrink a lesser amount than the substrate, due to a higher coefficient of thermal expansion (CTE) being present for the substrate in comparison with that of the silicon chip. This differential in shrinkage generates high tensile stresses during thermal cycling in the backside of the silicon chip or wafer tending to cause the formation of microcracks in the silicon chip at the locations of existing minute scratches. Consequently, it is imperative that steps be taken to prevent the cracks propagating from the backside scratches on the silicon chip or wafer towards the front surface thereof, whereby such scratches can be nucleation sites for the cracks during package fabrication or thermal cycling, and which may cause package failure if propagating to the front side of the silicon chip or wafer, which represents the electronic device region of the electronic package incorporating the electrical contacts and circuitry, by a potential short-circuiting thereof.

2. Discussion of the Prior Art

Various methods and devices are currently known in the technology, which are adapted in diverse modes to inhibit or restrict the formation of scratches and propagation of microcracks in which the surfaces, and particularly the backside surfaces of semiconductor chips or wafers, which may be constituted of a silicon (Si) material.

Chang, et al., U.S. Pat. No. 6,887,793 B2, disclose a method for plasma etching a wafer subsequent to the backside grinding thereof, and wherein this etching is adapted to remove a photoresist coating layer present on the wafer surface. The method disclosed in this patent, has nothing in common with the chip or wafer backside treatment analogous to the present invention in preventing the formation of scratches or propagation of cracks in the backside of the wafer or chip.

Peterson, et al. U.S. Pat. No. 6,844,623 B1 disclose the application of a temporary coating for the protection of a microelectronic device wherein the coating is applied to a wafer surface and thereafter removed. This has no bearing on the method of treatment for protection of the backside of a semiconductor wafer or chip in a manner analogous to the present invention, which is adapted to either inhibit the formation of cracks or scratches or the propagation of cracks in the silicon wafer or chip.

Hendrix, et al., U.S. Pat. No. 6,514,835 B1 provide for a stress control method for thin films due to mechanical deformation of wafer substrates. Again, this has nothing in common with the inventive methods of protecting the backside of a silicon semiconductor chip or wafer from the formation or propagation of scratches and cracks, which could potentially adversely influence the integrity of an electronic package utilizing the wafer or chip.

Kane, et al., U.S. Pat. No. 6,790,125 B2 disclose an arrangement for finishing the backside of a wafer or chip by means of a milling machine, and wherein a subsequent polishing or wet etching method is employed to remove machine milling marks and scratches. The foregoing has nothing in common with the present inventive method of protecting the backside of a silicon wafer or chip from the deleterious effects of scratches and cracks which may be present therein, or which have a tendency to substantially propagate internally of the wafer or chip.

Finally, Maurice, et al., U.S. Patent Publication No. 2004/0241461 A1 discloses a method of protecting the back surface of a wafer by the application thereon of a capping layer thereon during the handling of the wafer. Again, this type of application of the capping layer is different from and has nothing in common with the method of protecting the backside of the wafer or chip pursuant to the present invention.

Accordingly, in order to prevent the formation of backside cracks or the propagation of cracks formed in the backside of a wafer or chip during processing thereof, pursuant to the invention, alternative methods may be utilized, which present significant advantages over the current state of the technology.

SUMMARY OF THE INVENTION

Pursuant to one particular aspect or embodiment of the invention, the backside of a silicon wafer or chip is equipped with a protective film layer, which is constituted of a material possessing a high degree of hardness, which will prevent the formation of cracks in the backside of the chip and propagation thereof during the subsequent processing of the wafer, such as under high thermal cycling conditions, and protect any electronic components and devices located on the front side of the chip or wafer.

In accordance with a further aspect of the invention, the backside of a silicon wafer or chip may be equipped with a protective film layer having a high fracture toughness, in effect, resistance to fracture, which will prevent the propagation of any scratches which are present in the backside surface of the wafer or chip, and which, during high temperature processing and thermal cycling when combining the wafer or chip with a substrate, may cause high tensile stresses encountered in the chip or wafer due to differences in the coefficients of thermal expansion with the substrate, to have the scratches from cracks propagating into the wafer or chip tending to adversely influence the integrity of an electronic package incorporating the silicon chip or wafer.

As represented in a further aspect of the present invention, rather than equipping the backside of the chip or wafer with a film layer, as described hereinabove, the backside of the wafer or chip may be wet etched in order to blunt the internal tip or sharp leading point or apex of any micro crack, which may have already propagated into the silicon wafer or chip. This will reduce any stress concentrations and inhibit the crack from propagating further towards the front side of the chip or wafer where the crack could potentially adversely influence the integrity and functioning of electronic contacts or devices located on that surface.

Accordingly, it is an object of the present invention to provide novel methods for inhibiting the formation or propagation of micro cracks in the backside surface of semiconductor chips or wafers.

Another object of the present invention resides in an arrangement for inhibiting the formation or propagation of micro cracks in the backside surfaces of semiconductor chips or wafers.

BRIEF DESCRIPTION OF THE DRAWINGS

Accordingly, in order to clearly represent the inventive aspects, reference may now be made to the following detailed description, taken in conjunction with the accompanying drawings; in which.

DETAILED DESCRIPTION OF THE INVENTION

Figure 1:
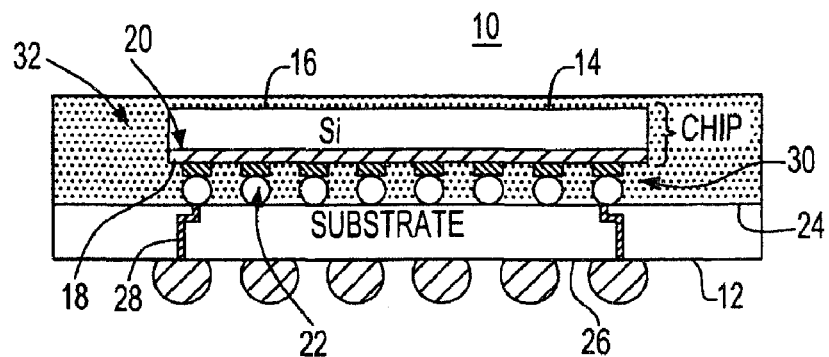
FIG. 1 illustrates generally diagrammatically a side sectional view of one embodiment of an electronic package incorporating a silicon semiconductor chip structure.

Referring in detail to the drawings, wherein throughout the various embodiments, similar or identical components are designated with the same reference numerals, FIG. 1 illustrates, generally diagrammatically, an electronic package 10 including a substrate layer 12, on which there is arranged a silicon semiconductor chip 14 (or wafer) which has a backside surface 16 facing away from the substrate 12 and a front side 18, which includes a device region 20, in effect, electronic circuitry and connections (not shown) and to which there are adhesively fastened or soldered arrays of solder balls 22, which are in contact with the facing surface 24 of the substrate 12. All. of the foregoing components may be fabricated in the flip-chip technology, as is well known in the state of the art. Hereby, the solder balls 22 may be connected to the semiconductor chip 14 through C-4 (controlled collapse chip connects), as widely employed. Communicating with the opposite side 26 of the substrate by means of electrical connections to further electrical components, such as bond pads or the like, are the solder balls through suitable electrically conductive vias 28, extending through the substrate 12. The silicon chip 10 may include an underfill 30 in the region facing the substrate 12 extending about the solder balls 22, and is encompassed by a suitable dielectric encapsulant 32 so as to form a protective environment and which is also in contact with the facing surface 24 of the substrate about the periphery of the underfill 30.

Figure 2:
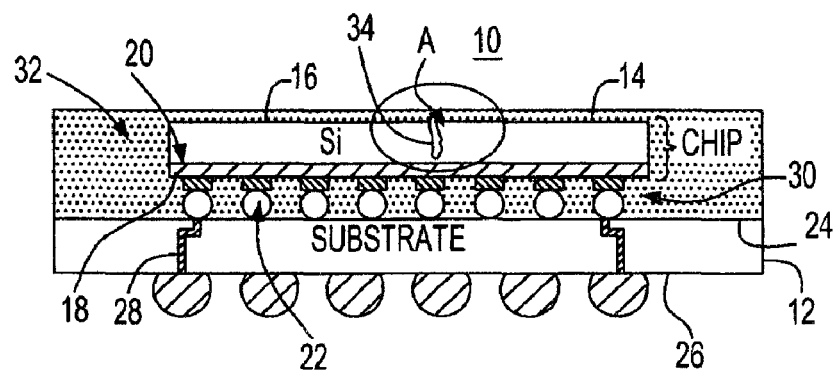
FIG. 2 illustrates the arrangement of FIG. 1, showing the silicon chip with the presence of a crack in the backside surface.
Figure 3:
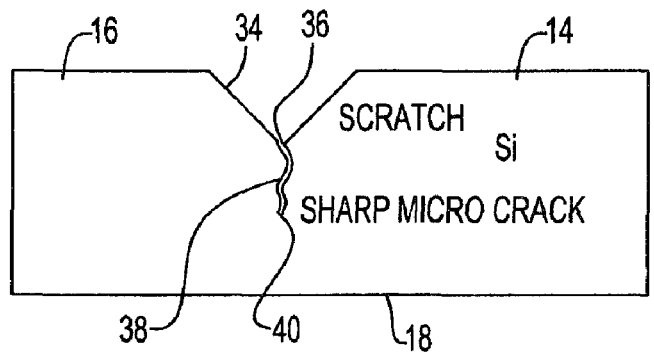
FIG. 3 illustrates, on an enlarged scale, the fragmentary encircled portion A of the silicon chip displaying a scratch and microcrack which has formed in the backside surface thereof.

As indicated in FIG. 2 of the drawings, upon occasion, the backside surface 16 of the silicon chip 14 (or wafer), as represented on an enlarged scale in FIG. 3 by the encircled portion A of FIG. 1, shows a scratch 34 having been previously formed in the silicon chip, possibly during grinding or the like surface finishing. This scratch may then, during packaging of the components and exposure to reflow and/or thermal cycling, nucleate into a sharp-pointed micro crack 38 due to a stress concentration at the sharp bottom tip or apex 36 of the scratch, and which micro crack 38 extends into the chip interior so as to end in a pointy tip 40.

As shown in FIGS. 2 and 3 of the drawings, the micro crack 38 may extend downwardly, so as to cause it to propagate towards the front surface 18 of the chip 14, which faces the region of the active devices and electronics. This microcrack 38, when propagating through the entire thickness of the silicon chip, may then potentially result in a short-circuiting and create functional problems in the electronic package, and possibly render the latter subject to failure.

Figure 4:
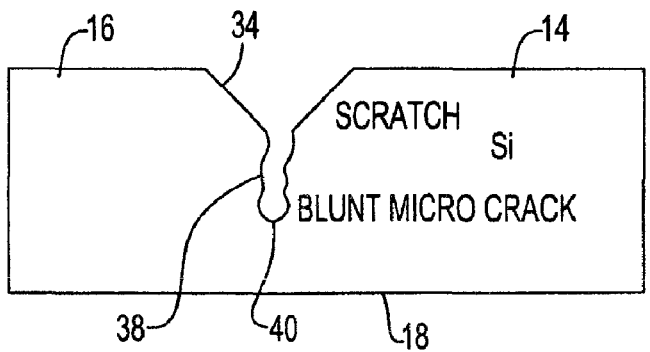
FIG. 4 illustrates, in a view similar to FIG. 3, a wet etch treatment of the silicon chip to blunt the microcrack in order to reduce generated stresses.

In this instance, prior to the forming of the package, in the event that the backside surface 16 of the silicon chip 14 evidences the presence of a scratch 34 which has propagated into a sharp-pointed micro crack 38 extending at least partially through the thickness of the silicon chip towards the front surface 18 thereof, the chip is subjected to a wet etch process in order to widen and blunt the tip 40 of the micro crack 38, as shown in FIG. 4, and thereby eliminate any stress concentration factor which would tend to cause the micro crack 38 to propagate further through thickness of the silicon chip 14. This wet etch may be constituted of a solution of $HF/HNO_3$, or other solutions which may exert such a blunting effect on the configuration of the microchip.

Figure 5:
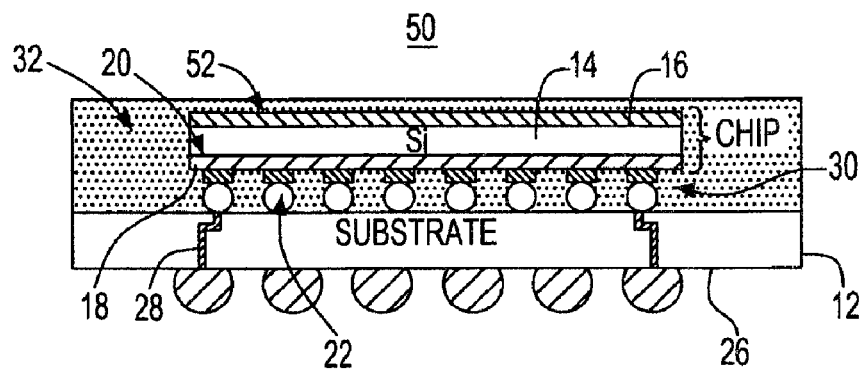
FIG. 5 illustrates in a diagrammatic view similar to FIG. 1, the application of a crack preventive layer on the backside of the semiconductor chip.
Figure 6:
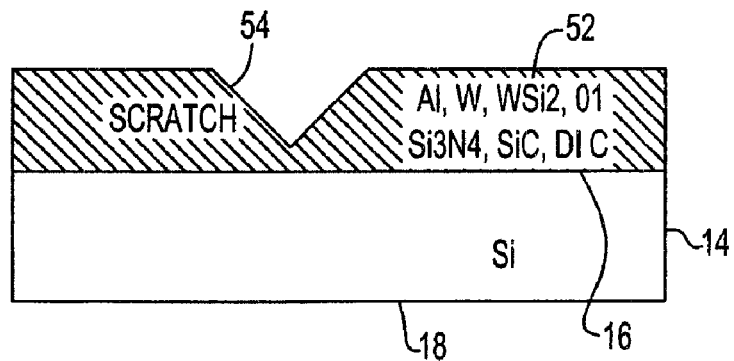
FIG. 6 illustrates, on an enlarged scale, a fragmentary portion of the chip of FIG. 5 showing the film layer for preventing the formation of cracks in the silicon chip.

Pursuant to a further method of the present invention, as shown in FIGS. 5 and 6 of the drawings, wherein various structural components are identical or similar to those in FIG. 1, set forth that prior to the processing and joining of the silicon wafer or chip 14 to the substrate 12 and encapsulation thereof to form the electronic package 50, the backside surface 16 of the silicon wafer or chip 14 is equipped with a protective film layer 52 of a crack prevention material, as described hereinbelow In one instance, this film material 52 possesses the property of high fracture toughness, such as an aluminum alloy. This film material, which is intended to prevent the scratching of the silicon wafer or chip 14, after being contacted and located therebeneath may be subject to scratches 54, which do not pass through so as not to penetrate into the silicon backside surface 16; i.e., thereby protecting the latter from forming micro scratches. Materials which also possess a high degree of fracture toughness and which would be suitable for the film layer when applied to the backside surface 16 may be $WSi_2$ having a fracture toughness of approximately 5.6 MPa m$^{1/2}$; $SiO_2$ with 0.85 to 1.15 MPa m$^{1/2}$; or aluminum alloys possessing a toughness of 33 to 54 MPa m$^{1/2}$. Also employable is tungsten (W) with a toughness of 5.6 to 8.7 MPa m$^{1/2}$, which is applied after a silicide process, or SiC with a fracture toughness of 3.1 MPa m$^{1/2}$; $Si_3N_4$ with 8.3 MPa m$^{1/2}$ and wherein the silicon (Si) per se, has a toughness of 0.79 to 0.95 MPa m$^{1/2}$. The aluminum is normally applied subsequent to a contact process, whereas the tungsten is ordinarily applied after effectuating a silicide process step.

In the event that the backside surface 16 of the silicon wafer or chip 14 is provided with a film layer 52 possessing a high degree of hardness in order to prevent the formation of scratches in the chip backside surface 16, as also shown in FIG. 6 of the drawings, applied at preferably the beginning of the packaging process is a film layer constituted of $Si_3N_4$, SiC, DLC or $WSi_2$; whereby $Si_3N_4$ has a hardness of about 14 GPa; SiC of 15-30 GPa; and a diamond-like carbon at 20 GPa; and with the silicon (Si) of approximately 12 GPa.

This process of applying the crack prevention film material to the backside surface of the silicon chip or wafer prior to implementing the process of heat bonding with the substrate 14, encompassing with the encapsulant 32 will prevent the formation or propagation of micro cracks in the silicon chip or wafer.

It may also be advantageous that, under some circumstances, the backside surface of the chip or wafer is subjected to a wet etch treatment, as described hereinabove, and thereafter has a protective film layer 52 applied thereto.

From the foregoing, it becomes readily apparent that by utilizing the foregoing methods of protecting the silicon chip or wafer from the propagation or formation of cracks tending to propagate towards the front side of the chip containing the electronic devices or connections, this will provide an assurance that subsequent to the adhesion to the substrate and encapsulation with the dielectric adhesive, the electronic package will be secure from potential failure during operation.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A method of preventing the formation and propagation of backside surface micro cracks in a silicon chip or wafer to a front surface thereof, at which said chip or wafer is adapted for operative connection with components to form electronic package arrangement; said method comprising:

applying at least one protective crack prevention and scratch-resistant material to a backside surface of said chip or wafer during a process of forming said electronic package arrangement so as to inhibit the forming of micro cracks in said chip or wafer while being subjected to high temperatures during said forming process and thermal cycling encountered in the operation of the electronic package arrangement, said at least one protective crack prevention and scratch-resistant material being essentially a film layer possessing a high degree of fracture toughness which is adhered to the backside surface of said chip or wafer; said film layer being selected from the group of materials consisting of $WSi_2$, Al alloys, tungsten, SiC, Si and composites thereof.

2. A method of preventing the formation and propagation of backside surface micro cracks in a silicon chip or wafer to a front surface thereof, at which said chip or wafer is adapted for operative connection with components to form electronic package arrangement; said method comprising:

applying at least one protective crack prevention and scratch-resistant material to the backside surface of said chip or wafer upon initiating the process of forming said electronic package arrangement so as to inhibit the forming of micro cracks in said chip or wafer while being subjected to high temperatures during said forming process and thermal cycling encountered in the operation of the electronic package arrangement; said crack prevention material being essentially a film layer possessing a high degree of hardness resistive of scratch-formation which is adhered to the backside surface of said crack or wafer; said film layer being selected from the group of materials consisting of SiC, $WSi_2$ and combinations thereof.

* * * * *